United States Patent [19]

Yamada et al.

[11] Patent Number: 5,616,955

[45] Date of Patent: Apr. 1, 1997

[54] POWER TRANSISTOR MODULE WIRING STRUCTURE

[75] Inventors: Toshifusa Yamada; Shin Soyano; Etsuo Arai; Manabu Watanabe, all of Nagano; Seiki Igarashi, Tokyo, all of Japan

[73] Assignee: Fuji Electric Co., Ltd., Tokyo, Japan

[21] Appl. No.: 231,338

[22] Filed: Apr. 22, 1994

[30] Foreign Application Priority Data

Apr. 23, 1993 [JP] Japan ................................. 5-097434
Jul. 27, 1993 [JP] Japan ................................. 5-184267
Oct. 28, 1993 [JP] Japan ................................. 5-269353

[51] Int. Cl.$^6$ .......................... H01L 23/52; H01L 23/528
[52] U.S. Cl. .......................... 257/690; 257/691; 257/692; 257/724; 257/797
[58] Field of Search ................................. 257/690, 691, 257/693, 698, 723, 724, 692, 797

[56] References Cited

U.S. PATENT DOCUMENTS

| 4,920,405 | 4/1990 | Itoh et al. ........................... 357/74 |
| 5,243,217 | 9/1993 | Yamada ............................. 257/692 |
| 5,306,949 | 4/1994 | Yamada et al. ..................... 257/690 |
| 5,347,158 | 9/1994 | Matsuda et al. .................... 257/724 |

FOREIGN PATENT DOCUMENTS

| 0427143 | 5/1991  | European Pat. Off. |
| 0455322 | 11/1991 | European Pat. Off. |
| 0527033 | 2/1993  | European Pat. Off. |
| 3516995 | 11/1985 | Germany. |
| 9203000 | 6/1992  | Germany. |

Primary Examiner—Peter Toby Brown
Attorney, Agent, or Firm—Brumbaugh, Graves, Donohue & Raymond

[57] ABSTRACT

In packaged bridge circuit modules with power switching transistors such as IGBT's, internal wiring inductance can cause switching voltage spikes and imbalance between switching transistors. Upon inclusion of suitably arranged and configured inductance elements, internal wiring inductance can produce a counter-electromotive force during switching. To this end, an internal connecting terminal may branch from an output terminal, a bridge-shaped internal connecting terminal may be connected between an emitter circuit pattern of one power transistor and a collector circuit pattern of another power transistor, or signal terminals as auxiliary emitter terminals of two power transistors may be connected to an inductance providing region in a current path of an emitter circuit pattern.

8 Claims, 9 Drawing Sheets

POWER TRANSISTOR MODULE WIRING STRUCTURE

BACKGROUND OF THE INVENTION

The present invention relates to a power transistor module for use in a power switching device, and to its internal wiring structure.

Products with power transistor modules have become widely available, including a bridge circuit with IGBT's (Insulated Gate Bipolar Transistors) as power switching elements, for example. In such modules, several interconnected transistor chips are assembled in the same package.

A prior art module is illustrated by FIGS. 10a and 10b for a half bridge structure with two power transistors. FIG. 10a shows a metal base 1 for heat dissipation, an insulating substrate 2 for the circuit, a copper foil circuit pattern 3 formed on the insulating substrate, a power transistor chip 4 such as an IGBT chip (herein referred to as "transistor" for short), a freewheel diode chip 5 (herein referred to as "freewheel diode" or simply "diode" for short) connected in parallel with the transistor 4, external output terminals 6, 7 and 8 for use with a main circuit, signal terminals 9 and 10 taken out from auxiliary emitter terminals for each of the transistors, an internal lead 11 connecting together the signal terminals 9 and 10 and the external output terminals 7 and 8, and bonding wires 12 connecting the transistors 4 and diodes 5 to the circuit pattern 3. A circuit substrate such as a DBC substrate (Direct Bonding Copper substrate) or an insulated aluminum substrate may be used as the circuit substrate 2. Within parentheses, FIG. 10a includes symbols in correspondence with elements and terminals of the equivalent circuit of FIG. 10b. Specifically designated are power transistors Tr1 and Tr2 for the upper and lower arms of the bridge circuit, freewheel diodes D1 and D2, collector terminal C1 for the transistor Tr1, the common terminal C2E1 for the emitter of the transistor Tr1 and the collector of the transistor Tr2, the emitter terminal E2 for the transistor Tr2, signal terminals (auxiliary emitter terminals) e1 and e2 for the transistors Tr1 and Tr2, and gate terminals G1 and G2.

Figure 10:
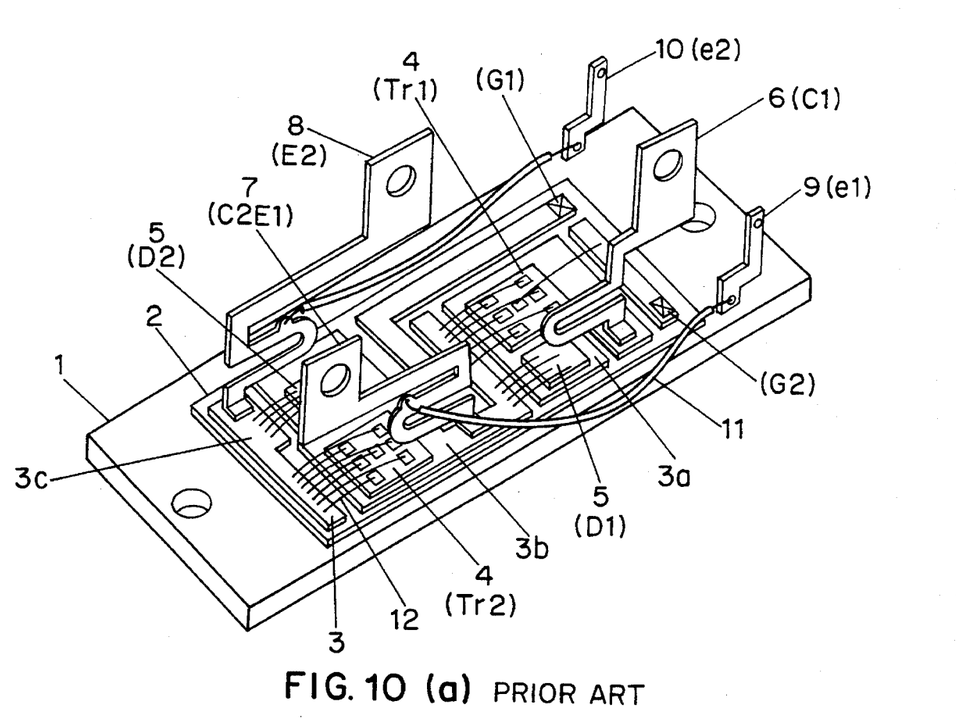

As shown in FIG. 10, the external output terminal 6 is taken out from the collector pattern part 3a on which the transistor Tr1 and the diode D1 are mounted, and the external output terminal 7 is taken out from the collector pattern part 3b on which the transistor Tr2 and the diode D2 are mounted. A bonding wire 12 connects the collector pattern part 3b to the emitter electrode of the transistor Tr1 and the diode D1. The external output terminal 8 (E2) is taken out from the emitter pattern part 3c for the transistor Tr2. The signal terminals 9 (e1) and 10 (e2) as the auxiliary emitter terminals are connected to the terminal pads for the respective external output terminals 7 (C2E1) and 8 (E2) with leads 11 at positions which provide internal wiring inductances L1 and L2 shown in the equivalent circuit of FIG. 10b. The gate terminals G1 and G2 are taken out from a gate pattern part connected by wire to the gate electrodes for the transistors Tr1 and Tr2.

The internal wiring inductances L1 and L2 are provided for inducing a voltage due to counter-electromotive force at turn-off of the transistors. The induced voltage is applied to the gate so that it weakens the drop of the gate voltage and reduces the magnitude of −di/dt, so that a gate-emitter voltage surge is suppressed. For balanced switching operation between the transistors Tr1 and Tr2, it is necessary for the wiring inductances L1 and L2 to have suitably chosen values.

In this device, difficulties arise at increased switching frequencies, due to the internal wiring inductance L1 provided by the signal terminal e1 for the driving signal of the transistor Tr1.

Figure 11:
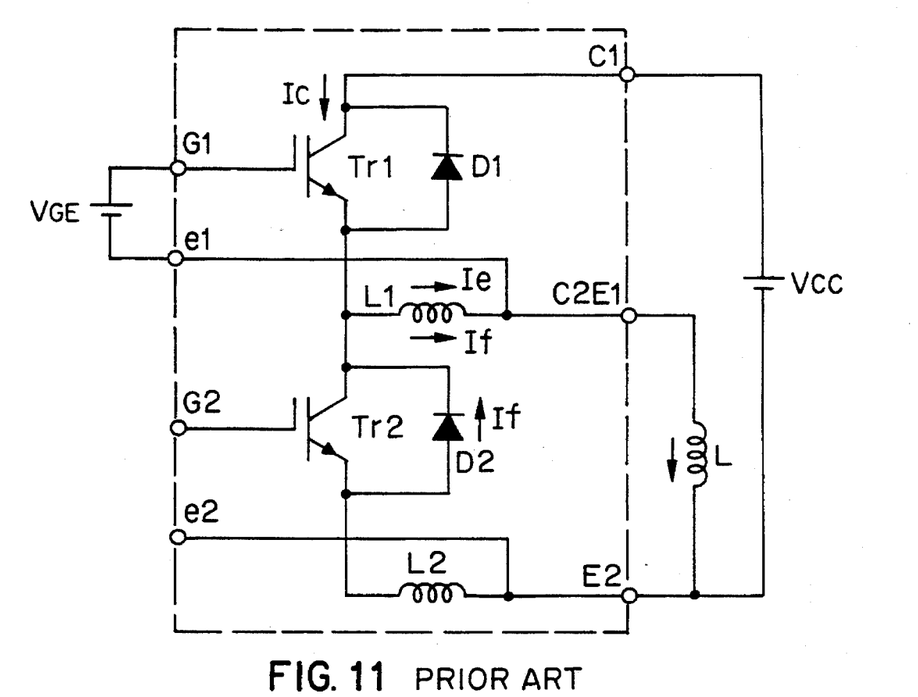
FIG. 11 is a circuit diagram for the structure of FIG. 10a in switching operation.

This will be described with reference to FIG. 11 which shows the load current flow in the circuit of FIG. 10b during switching. When transistor Tr1 is on and transistor Tr2 is off, the emitter current Ie of the transistor Tr1 flows to the load L via the inductance L1. On the other hand, when the transistor Tr1 is turned off and the collector current Ic becomes zero, a freewheeling current If flows continuously in the same direction as Ie via the diode D2 into the internal wiring inductance L1 as a result of the freewheeling operation of the diode D2. Then, no sufficient counter-electromotive force is induced in the internal wiring inductance L1. This does not sufficiently suppress the above-mentioned voltage surge, and results in malfunctioning in the transistor drive circuit and in externally connected equipment to be controlled.

Contrary to this, in the transistor Tr2 of the lower arm, the current which flows through the internal wiring inductance L2 on the side of the signal terminal e2 varies according to the turning on or turning off of the transistor Tr2, since the freewheeling current does not flow through the inductance L2). Therefore, the voltage due to the counter-electromotive force generated in the inductance L2 is applied to the drive circuit for the transistor Tr2 via the signal terminal e2, so that the voltage surge can be suppressed.

Thus, with prior art internal wiring structure for of power transistor module, large voltage surges are produced in high speed switching especially in the upper arm including the transistor Tr1. Also, a difference arises in the size of a voltage rise between the transistor Tr1 on the upper arm and the transistor Tr2 on the lower arm. This causes unstable switching characteristics of the module.

SUMMARY OF THE INVENTION

It is an object of the invention to provide a power transistor module with an improved wiring structure within the module, for suppressing rapid changes in the voltage and current (dv/dt and di/dt) during switching, and for balanced operation of the upper and lower arms.

A power transistor module with at least two power transistor chips Tr1 and Tr2 may be packaged as a minimum unit, with transistor chips connected internally in series as the upper and lower arms of a bridge circuit. For use with a main circuit, external output terminals C1, C2E1 and E2, and gate terminals G1 and G2 are taken out from a circuit pattern for the circuit substrate on which the transistor chips Tr1 and Tr2 are mounted.

The power transistor chips Tr1 and Tr2 may have separate circuit patterns, signal terminals e1 and e2 connected to the external output terminals C2E1 and E2 as auxiliary emitter terminals for the power transistor chips Tr1 and Tr2, and an internal connecting terminal branching from the point at which the signal terminal e1 is connected to the external output terminal C2E1 providing a desired value of internal wiring inductance between the point at which the signal terminal e1 is connected to the external output terminal C2E1 and the emitter pattern for the power transistor chip Tr1.

The internal connecting terminal may be connected to and integrally formed with the external output terminal from which the internal connecting terminal branches.

The power transistor chips Tr1 and Tr2 may have separate circuit patterns, a bridge shaped internal connecting terminal connected between an emitter pattern part for the power transistor chip Tr1 and a collector pattern part for the power transistor chip Tr2, and a signal terminal e1 connected as an auxiliary emitter terminal for the power transistor Tr1 to the point on the internal connecting terminal where a desired value of internal wiring inductance is provided between the internal connecting terminal and the emitter pattern part for the power transistor Tr1.

A bridge type internal connecting terminal may be loosely supported to allow its vertical movement by a terminal block as a supporting member of the external output terminal.

The internal connecting terminal may be buried in a gel filling material injected into the package.

An emitter pattern part for the power transistor chip Tr1 and a collector pattern part for the power transistor chip Tr2 may be formed in the circuit pattern on the substrate so as to be connected, an inductance providing region formed in a current path of the emitter pattern part for each one or more of the power transistor chips Tr1 and Tr2, and signal terminals e1 and e2 as auxiliary emitter terminals for each of the power transistors Tr1 and Tr2 connected to the point on the inductance providing region where a desired value of internal wiring inductance is provided.

The inductance providing region may be formed by providing a slit which divides the width of the current path of the emitter pattern part on the substrate.

Marks to indicate the position for the connection points of the signal terminals may be formed along the inductance providing region.

The external output terminal E2 may be connected to the emitter pattern part for the power transistor chip Tr2 on the lower arm at a position next to the connecting point for the signal terminal e2.

BRIEF DESCRIPTION OF THE DRAWING

FIG. 1b is an equivalent circuit diagram for the module of FIG. 1a.

FIG. 2 is a schematic side view of important parts of the module of FIG. 1a.

FIG. 6b is a side view of the module of FIG. 6a.

FIG. 8b is a bottom view of the package of FIG. 8a.

FIG. 9b is an equivalent circuit diagram for the wiring of FIG. 9a.

FIG. 10a is a perspective view of internal structure of a prior art power transistor module.

FIG. 10b is an equivalent circuit diagram for the structure of FIG. 10a.

DETAILED DESCRIPTION OF PREFERRED EMBODIMENTS

In the figures, analogous parts have the same reference numeral.

Figure 1A:
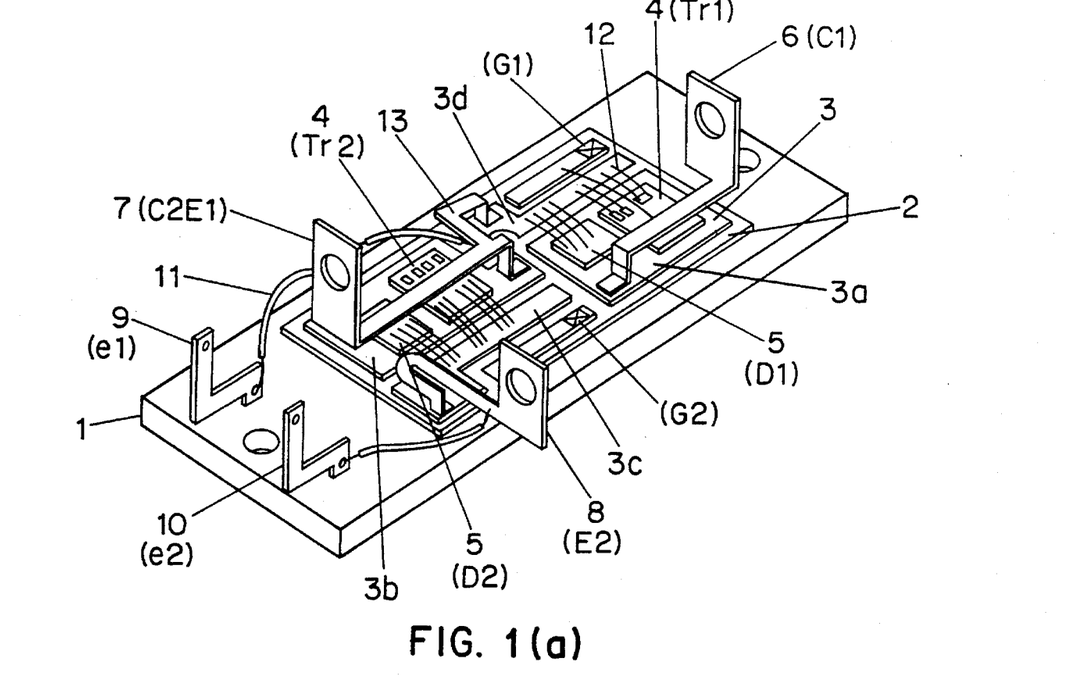
FIG. 1a is a perspective view of a power transistor module assembly according to a preferred first embodiment of the invention.

FIG. 1a shows an emitter pattern part 3d of a copper foil pattern 3 formed on an insulating substrate 2 for a transistor Tr1 on the upper arm of a half bridge, and a separate collector pattern part 3b for a transistor Tr2 on the lower arm. The emitter and collector pattern parts are connected in series via an internal connecting terminal 13 which is integrally formed as a part of an external output terminal 7 (C2E1) of the pattern part 3b. A signal terminal 9 (e1) as an auxiliary emitter terminal for the transistor Tr1, is also connected with a lead 11 to the branching point of the external output terminal 7 (C2E1) and the internal connecting terminal 13. Other structure is as in FIG. 10a: the first transistor Tr1 and the diode D1, and the transistor Tr2 and the diode D2 are mounted on the separately formed pattern parts 3a and 3b, respectively. External output terminals 6 (C1) and an external output terminal 7 (C2E1) are externally taken out from the pattern parts 3a and 3b. The emitter electrode for the first transistor Tr1 and the diode D1 are connected to the emitter side pattern part 3d via bonding wire 12. The external output terminal 8 (E2) for the transistor Tr2 is taken out from the emitter pattern part 3c, with a signal terminal 10 (e2) being connected to this external output terminal 8 by a lead 11.

Figure 1B:
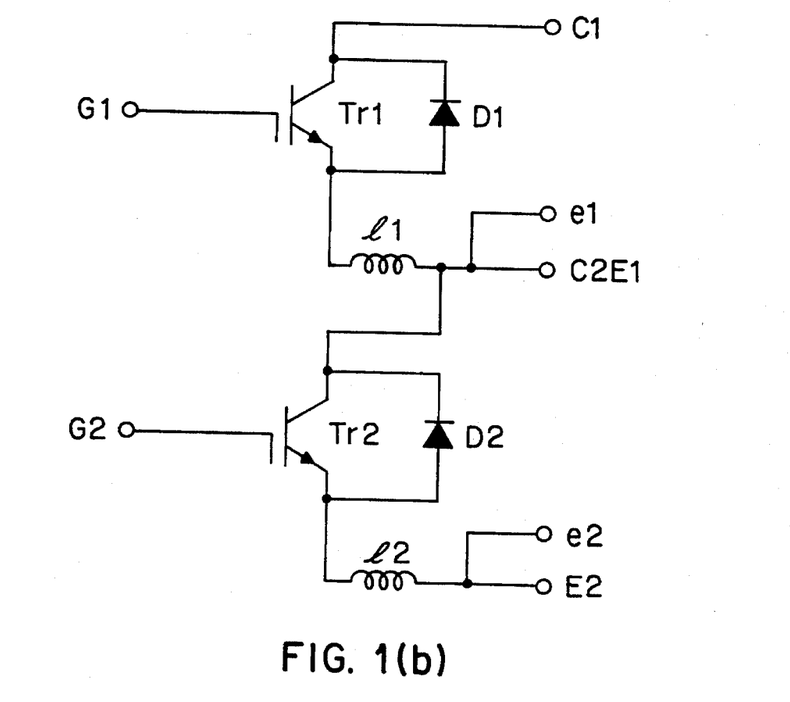
Figure 2:
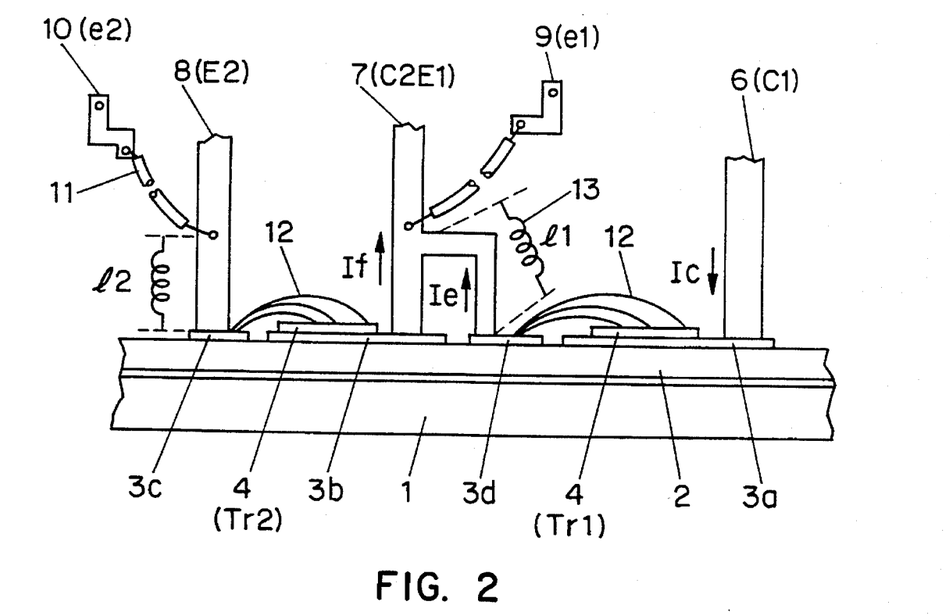

Here, the internal connecting terminal 13 is for providing the internal wiring inductance L1 in the equivalent circuit of FIG. 1b. The terminal dimensions, length and width, are then determined on the basis of the transistor chip characteristics and the switching device operating conditions so that the internal wiring inductance L1, as well as the internal wiring inductance L2 between the emitter pattern part 3c and the connecting point to the signal terminal 10 (e2) on the external output terminal 8 (E2) for the transistor Tr2 in FIG. 1, provides the optimum inductance value, L1=L2.

Figure 12:
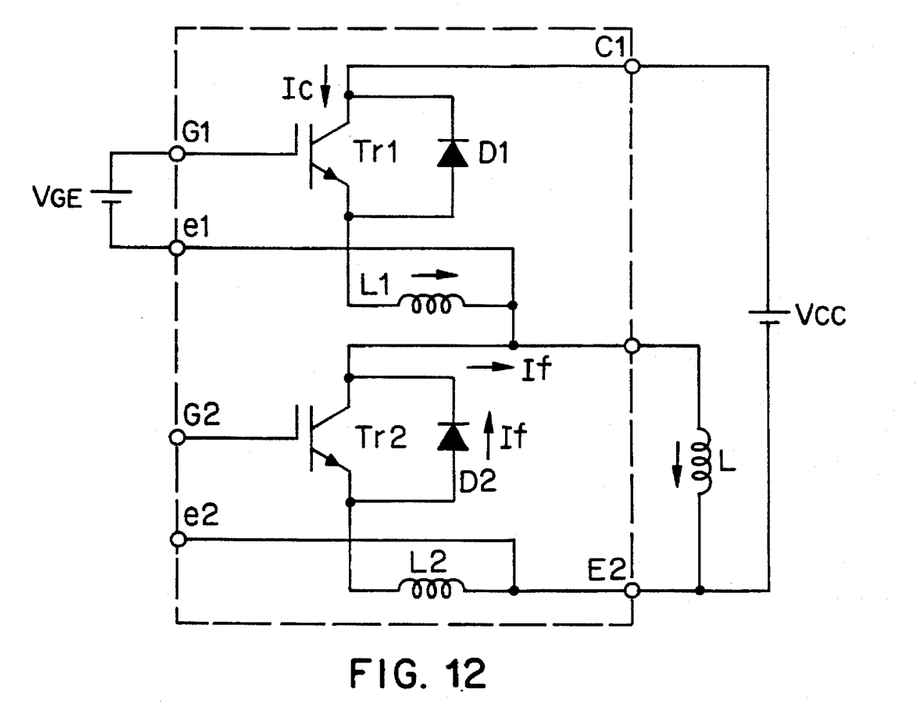
FIG. 12 is a circuit diagram for switching operation of a preferred structure according to a preferred embodiment of the invention.

With the above construction, as is illustrated in FIG. 12, when transistor Tr1 is on and transistor Tr2 is off, the current Ie of the transistor Tr1 flows through the internal connecting terminal 13 (inductance L1) to the external output terminal 7 (C2E1), from which it flows to an external load. On the other hand, when the transistor Tr1 turns off, a freewheeling current If does not flow through the internal connecting terminal 13 (inductance L1), but flows to the external load through the external output terminal 7 (C2E1). This current change induces a counter-electromotive force which induces a voltage in the internal wiring inductance L1 provided by the internal connecting terminal 13. By applying this voltage to the gate of the transistor Tr1 via the signal terminal e1, the voltage spike generated in response to the switching operation can be suppressed under the same conditions as for the transistor Tr2 on the lower arm. This results in balanced switching characteristics between the upper and lower arms.

Figure 13A:
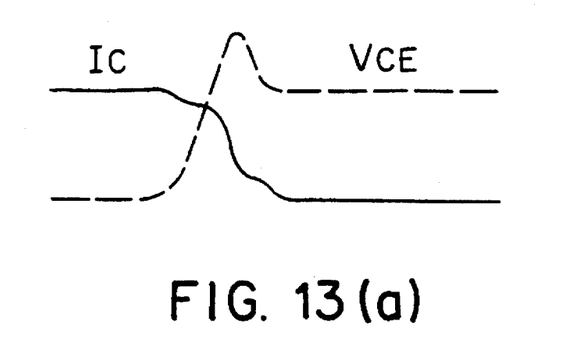
FIG. 13a is a diagram of voltage and current waveforms in the lower arm transistor Tr2 during switching of a power transistor module.
Figure 13B:
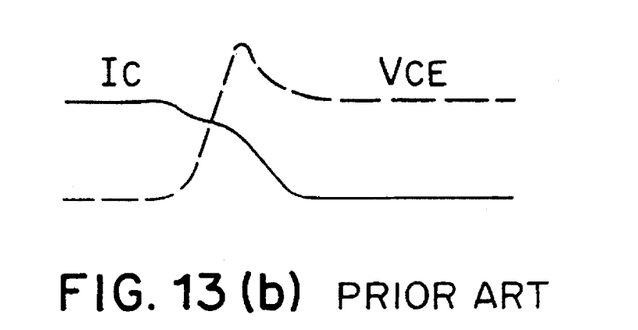
FIG. 13b is a diagram of voltage and current waveforms in the upper arm transistor Tr1 during switching of a power transistor module of the invention.
Figure 13C:
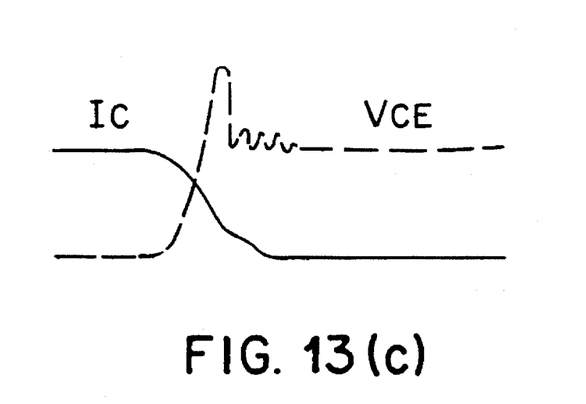
FIG. 13c is a diagram of voltage and current waveforms in the upper arm transistor Tr1 during switching of a prior art transistor module.

FIGS. 13a–13c illustrate a benefit from internal wiring structure of the invention in that switching surges in the transistor Tr1 are alleviated. Similar waveforms are obtained in operation of the transistors Tr1 {FIG. 13(b)} and Tr2 {FIG. 13(a)}, thus providing for balanced switching characteristics.

Figure 4A:
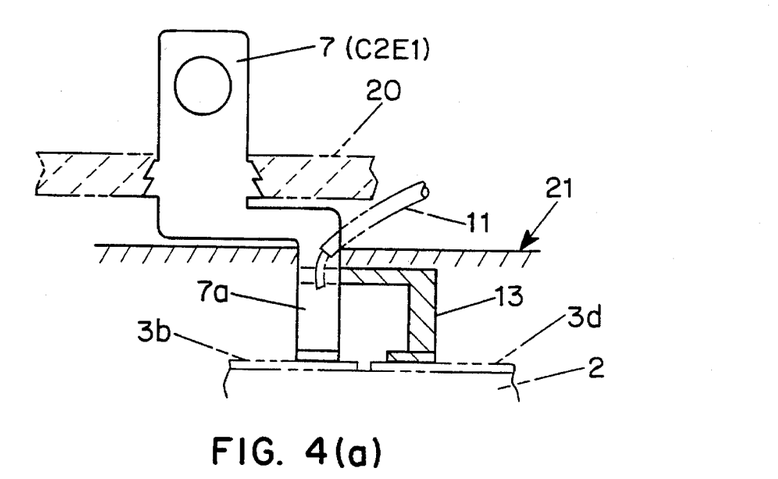
FIGS. 4a and 4b are side view schematics of different structures for the internal connecting terminal in the first embodiment

Examples of specific structures of the external output terminal 7 (C2E1) being formed integrally with the internal connecting terminal 13 are shown in FIG. 4a–4d. In FIG. 4a, the integrally formed internal connecting terminal 13 is shown branching from the middle part of the external output terminal 7. A lead insertion hole 7a for soldering the lead 11 for the signal terminal e1 is formed at the branching point. The internal wiring inductance L1 is provided by the hatched portion of the internal connecting terminal 13 which branches from this point. The internal connecting terminal 13 is then buried in a gel filling material 21 such as silicone gel, which is injected into the package so as to provide protection from mechanical stress caused by heat cycling in actual use.

Figure 4B:
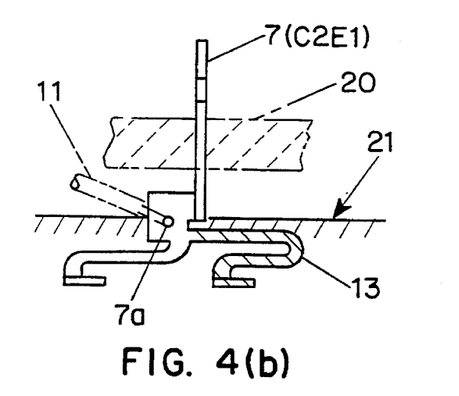

FIG. 4b shows an example in which the internal connecting terminal 13 branching from the external output terminal 7 has been lengthened to provide the desired value of the internal wiring inductance L1. Here, the internal connecting terminal 13 is bent into a hairpin shape in the horizontal direction and buried under a gel filling material 21 as in FIG. 4a.

Figure 4C:
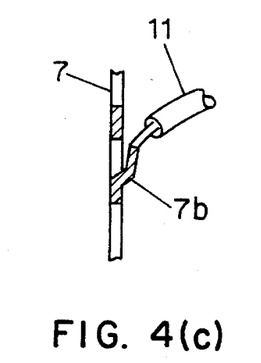
FIGS. 4c and 4d are schematics of connection structures for the signal terminal connecting leads in the first embodiment.
Figure 4D:
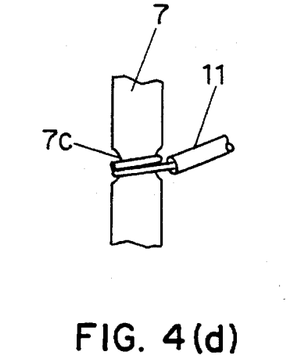

FIGS. 4c and 4d show alternative structures for connecting the external output terminal 7 and the lead 11. In FIG. 4c, a part of the external output terminal 7 is cut for providing a tongue 7b which holds the lead 11 for soldering. In FIG. 4d, notches 7c are provided on both sides of the external output terminal 7 around which the lead is then wound for soldering.

Figure 3:
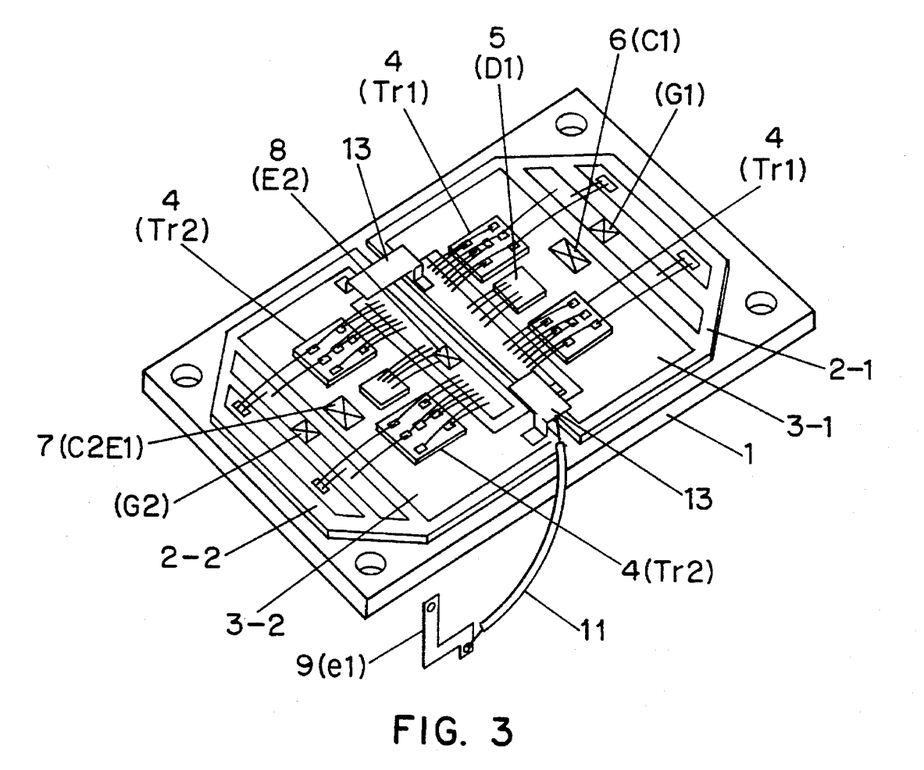
FIG. 3 is a perspective view of internal wiring structure of a module according to a preferred second embodiment of the invention.

In the embodiment illustrated by FIG. 3, both the upper and lower arms have transistor chips connected in parallel. Insulation layers 2-1 and 2-2 for the circuit pattern 3-1 for the upper arm, and the circuit pattern 3-2 for the lower arm are individually mounted on a heat dissipating metal base 1. The circuit patterns 3-1 and 3-2 are then connected together with bridge-shaped internal connecting terminals 13. A signal terminal 9 (e1) which becomes an auxiliary emitter terminal is then connected to the position on the internal connecting terminal with lead 11, at which position the desired value of the internal wiring inductance L1 (see FIG. 1b) is provided. The external output terminal 7 (C2E1) for the main circuit, which is formed as a separate part from the internal connecting terminal 13, is then taken out directly from the emitter pattern part of the circuit pattern 3-2 on which the transistor Tr2 and the freewheel diode D2 are mounted.

The operation of this embodiment brings about the same benefits as those of the first embodiment. By adjusting the value of the internal wiring inductance L1 provided by the bridge shaped internal connecting terminal 13 so as to get an appropriate value as in the first embodiment, the switching surge in the main circuit can be suppressed, and more balanced operation between the upper and lower arms can be achieved.

Figure 5A:
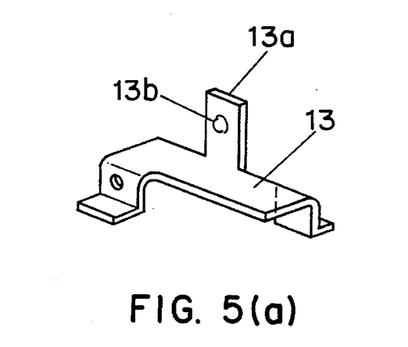
FIG. 5a is a perspective view of a bridge shaped internal connecting terminal in the second embodiment of the invention.
Figure 5B:
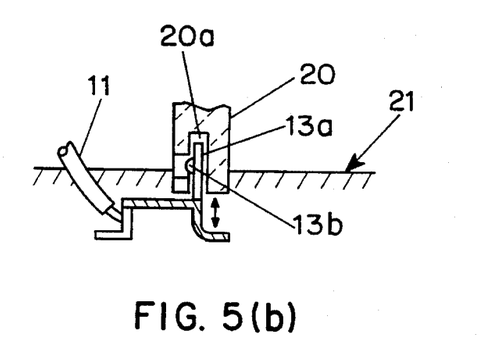
FIG. 5b is a schematic of the terminal of FIG. 5a with the terminal block attached.

FIGS. 5a and 5b illustrate a specific supporting structure for the bridge shaped internal connecting terminal 13. A support tab 13a extends upward from the middle part of the terminal which is bent into a modified U-shape, and a projection 13b is formed on the support tab 13a. Then, as shown in (b), the support tab 13a is loosely inserted into a groove 20a formed in a terminal block 20 serving as support member for the external output terminal, so that the support tab 13a is supported by the projection 13b. By using this support structure, slight shifts in the vertical direction can be accommodated, so that the bridge shaped internal connecting terminal 13 can be stably held for reflow soldering at the predetermined position on the circuit pattern. This bridge-shaped internal connecting terminal 13 is then buried as an assembly in a gel filling material 21 which is injected into the package as described for FIG. 4.

In FIGS. 6a–6c and FIG. 7, the transistors Tr1 and Tr2 and the freewheel diodes D1 and D2 are mounted on the pattern parts 3a and 3b separately formed on the circuit substrate as in FIG. 10. The external output terminals 6 (C1) and 7 (C2E1) are then taken out from the pattern parts 3a and 3b respectively, and the external output terminal 8 (E2) for the transistor Tr2 is connected to the pattern part 3c which is further connected to the emitter electrode of the transistor Tr2 by the freewheel diode D2 with the bonding wire 12. The pattern part 3b has an emitter pattern part 3e for the transistor Tr1 formed to be joined to the chip mount part of the pattern part 3b for the transistor Tr2. The pattern part 3e is connected to the emitter electrode of the transistor Tr1 and the freewheel diode D1 with the bonding wires 12.

Figure 6A:
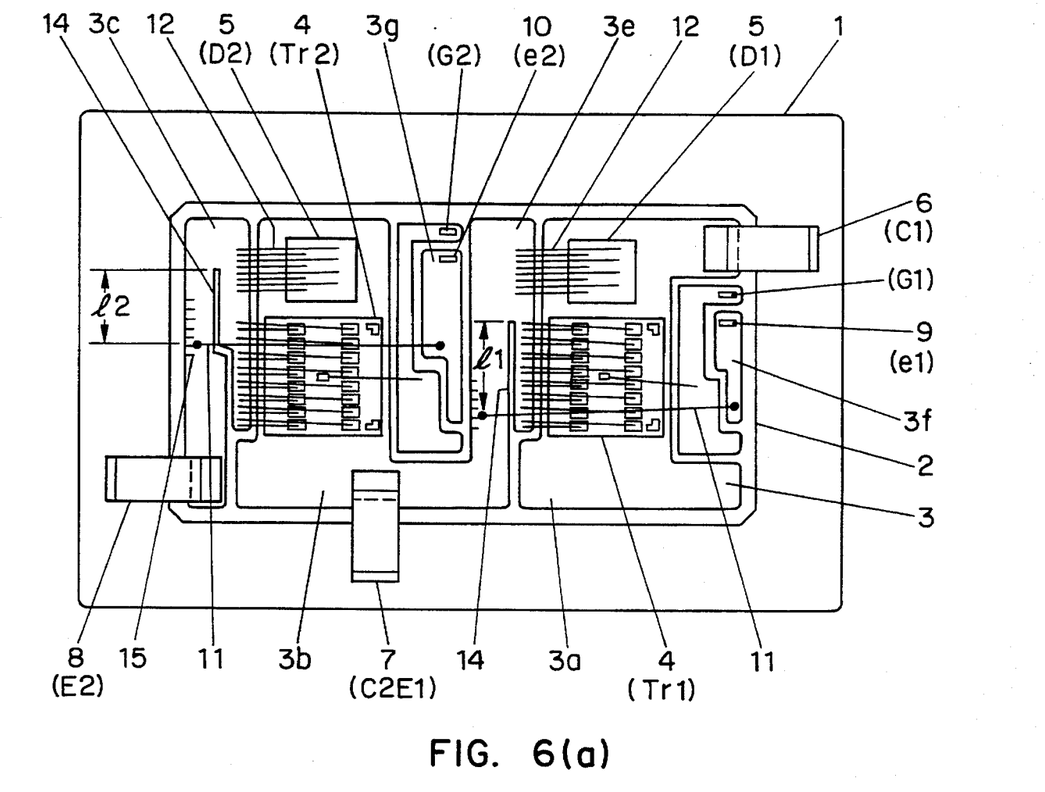
FIG. 6a is a schematic top view of a power transistor module according to a preferred third embodiment of the invention.
Figure 6B:
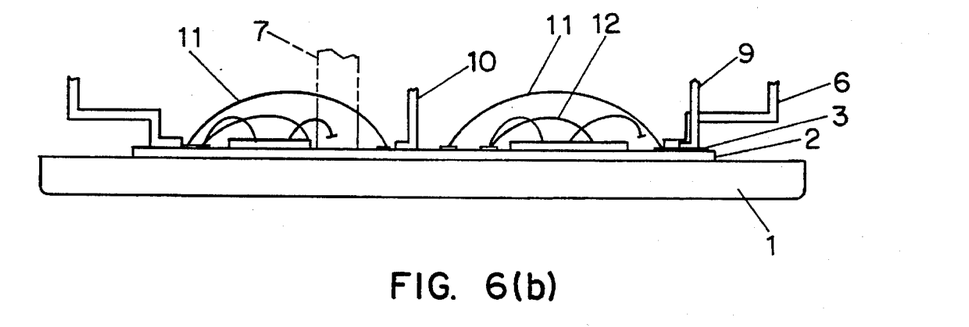
Figure 6C:
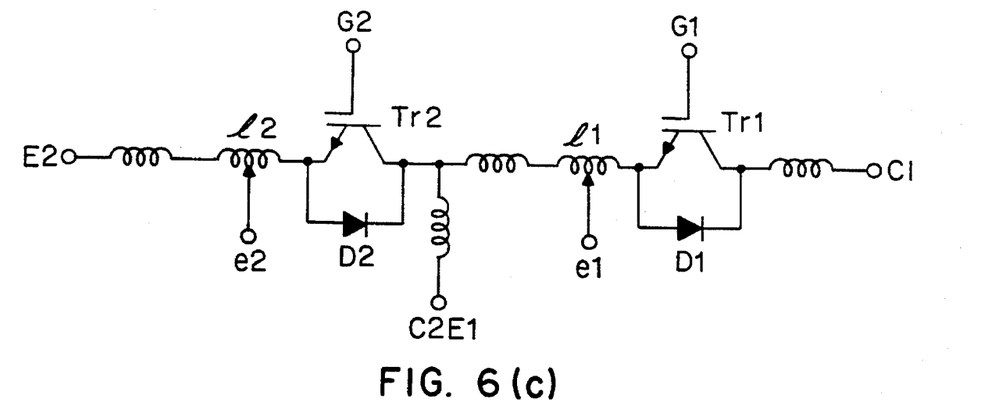
FIG. 6c is an equivalent circuit diagram for the module of FIGS. 6a and 6b.

On the other hand, the emitter signal terminals 9 (e1) and 10 (e2) for the transistors Tr1 and Tr2 are taken out from the pattern parts 3f and 3g which are formed separate from the aforementioned pattern parts. Moreover, the lead 11 (aluminum wire) connects the pattern parts 3f and 3g and the inductance providing regions formed in the emitter pattern parts 3e and 3c. Slits 14 are provided for dividing the limited width of the emitter pattern parts 3c and 3e so as to form hairpin shaped current paths. Bonding wires 12 taken out from the diodes and transistors are then bonded onto one side of the current path. The other side of the current path is used as the inductance providing region which provides a desired value of internal wiring inductance as in embodiments described above. By bonding the one end of the lead 11 within these inductance providing regions, the desired values L1 and L2 are provided by the parts from which the emitter signal terminals 9 (e1) and 10 (e2) are taken out.

The values of the internal wiring inductances L1 and L2 are subtly changed by shifting the connecting position of the lead 11 along the current paths formed in the pattern parts 3c and 3e. Advantageously, to facilitate positioning of the lead 11 based on specification, and for verification of correct positioning, positioning marks 15 are provided along the inductance providing region at experimentally predetermined positions with constant pitch, for example.

Figure 7A:
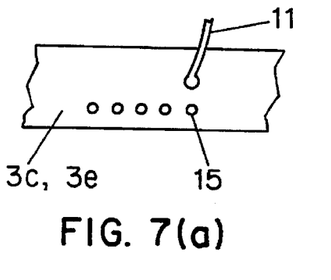
FIG. 7a is a schematic of round marks for indicating the position of the connection of the wire in the emitter pattern part of FIG. 6.
Figure 7B:
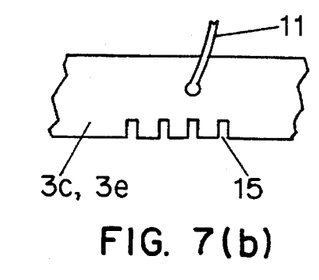
FIG. 7b is a schematic of slit shaped marks for indicating the position of the connection of the wire in the emitter pattern part of FIG. 6.

Specific examples of such marks 15 are shown in FIGS. 7a and 7b. In FIG. 7a, equally spaced round holes are shown along the inductance providing region for the pattern parts 3c and 3e. FIG. 7b shows equally spaced slits formed along the edge of the pattern parts 3c and 3e. In both cases, the marks can be used to specify/indicate and/or to recognize the bonding position of the lead 11.

As compared with the first and second preferred embodiments of the invention, providing inductances L1 and L2 by utilizing the emitter pattern part for each of the transistors as described has further advantages. Specifically, optimum internal wiring inductances can be provided in power transistor modules having standard terminals, independent of changing specifications for the modules, and without redesign and remanufacture of terminals. Required merely is proper internal location of lead wire connections.

Figure 9A:
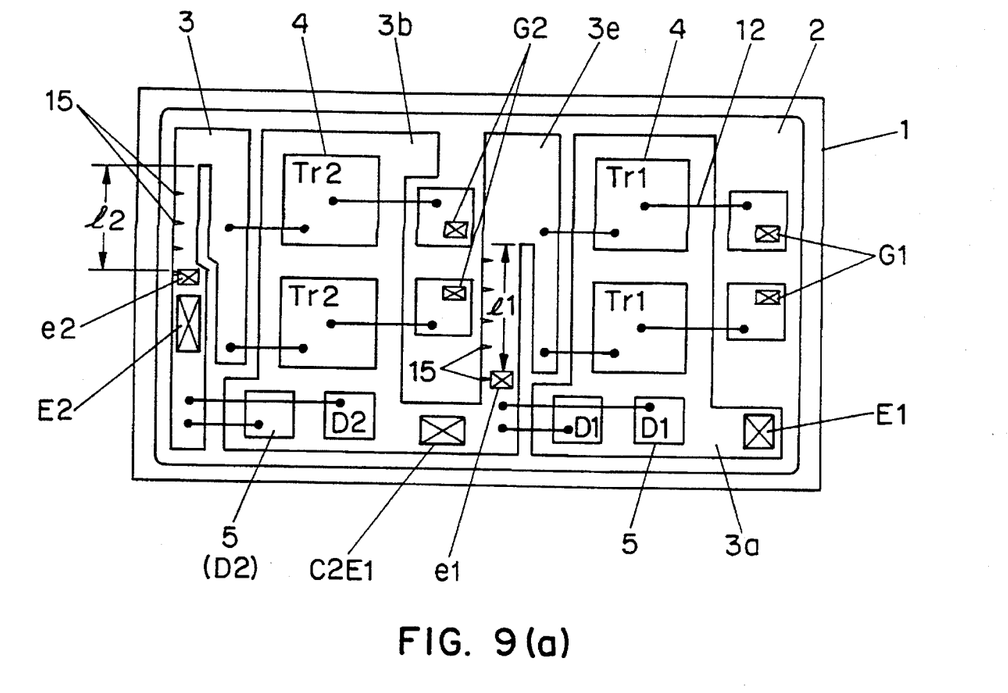
FIG. 9a is a schematic top view of internal wiring in an exemplary module according to the third embodiment.
Figure 9B:
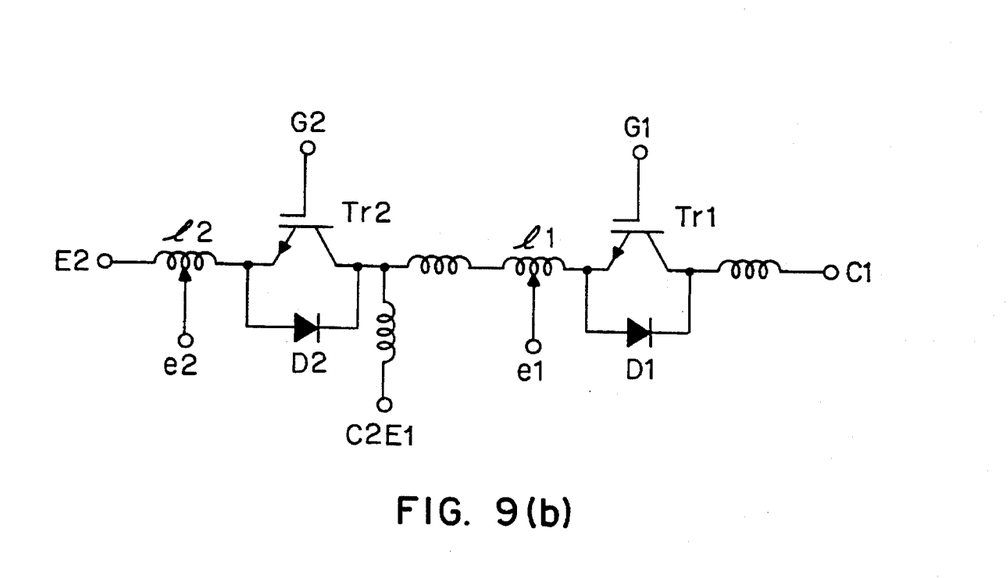

FIGS. 9a and 9b show modifications of the embodiment according to FIG. 6. Specifically, the external output terminal E2 of the emitter of the transistor Tr2 is on the emitter pattern part 3c, and is taken out from a point next to the signal terminal e2 connected to the inductance providing region described above. In this way, in comparing FIG. 6c with FIG. 9b, the inductance in the part between the part providing internal wiring inductance L2 on the emitter pattern part 3c, and the part for taking out the external output terminal E2 becomes almost zero.

By using this wiring structure, the inductance distribution of the wiring circuits on both sides of the transistor Tr1 on the upper arm is equal to that of the transistor Tr2 on the lower arm. As a result, with better balance and enhanced stability, the switching characteristics of the transistors Tr1 and Tr2 are improved.

A package structure for the power transistor modules in each of the embodiments described above is shown in FIGS. 8a and 8b. The package includes a metal base 1, a circuit substrate 2, circuitry including transistors 4, freewheel diodes 5 and external output terminals, and a resin case 16. In use, the package is fixed with screws 17 on a heat sink such as a cooling block fin 18. The resin case 16 is then filled up with sealing resin 19 encapsulate and protect the electronic components. Terminal blocks as described above but not illustrated here are attached to the upper surface of the resin case 16.

Figure 8A:
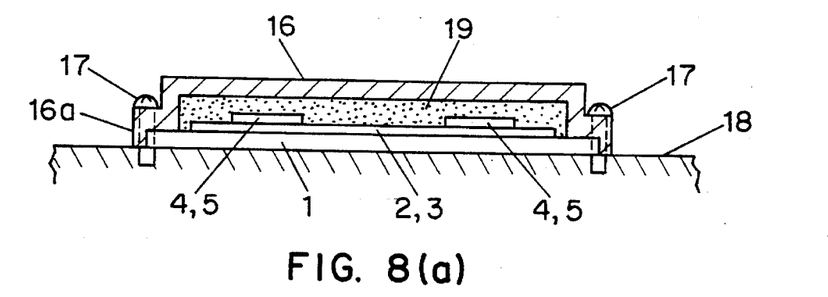
FIG. 8a is a lateral cross section of a package suitable for use with each of the above-mentioned preferred embodiments.
Figure 8B:
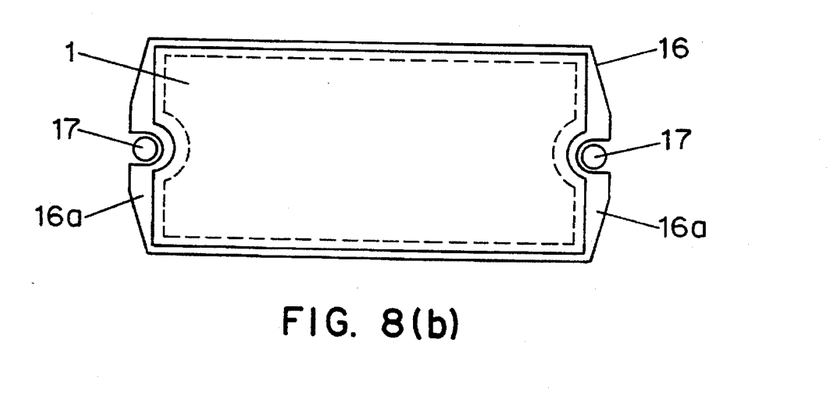

The outer edge of the metal base 1 is inlaid into the stepped peripheral edge part 16a of the resin case 16 where it is fastened with adhesive. As shown in FIG. 8b, slots are formed on opposite sides of the metal case 1 and the resin case 16 for accepting the screws 17. Upon fastening of the screws 17, the bottom of the metal base 1 closely contacts the upper surface of the heat sink 18, and there is no danger of separation of the resin case 1 from the metal base 1. Furthermore, as the metal base 1 is required merely to have minimum external dimension for mounting the internal circuit structure, material is used economically.

In exemplary transistor modules described above, a half bridge circuit assembly with two individual power transistor chips Tr1 and Tr2 internally interconnected in series is incorporated in a single package. Such packaging can also be used for power transistor modules forming two or more half bridge circuit assemblies, with each of the half bridge sections connected internally in parallel, for example. Thus, a single phase full bridge circuit or a three-phase full bridge circuit can be formed, including four or six power transistor modules, for example.

In each one of the power transistor modules described above, and as illustrated by the equivalent circuit of FIG. 12, an internal wiring inductance L1 is provided in series between transistors Tr1 and Tr2, and an auxiliary emitter terminal e1 for the transistor Tr1 is taken out via this internal wiring inductance L1. With this internal wiring structure, when the transistor Tr1 is turned on, the emitter current Ie flows to the load L through the internal wiring inductance L1. On the other hand, when the transistor Tr1 is turned off, a freewheeling current If flows from the external output terminal C2E1 to the load L without flowing through the internal wiring inductance L1. In this way, as is also the case for the switching operation of the transistor Tr2 on the lower arm, a voltage due to counter-electromotive force is induced as a result of the current change in the inductance L1. By then applying this induced voltage to the gate of the transistor Tr1 via the signal terminal e1, the voltage spike generated upon turning off can be suppressed. Thus, at the internal connecting terminal branching from the external output terminal C2E1 and connected to the emitter circuit pattern for the transistor Tr1, the bridge type connecting terminal connecting the circuit patterns for the transistors Tr1 and Tr2 or the inductance providing region for the emitter pattern part, by providing the optimum values for the internal wiring inductances L1 and L2 in accordance with the characteristics of the transistor chips Tr1 and Tr2 and the operating conditions of the switching device, a surge during switching can be suppressed, and a more balanced switching operation can be attained between the transistors Tr1 and Tr2, for a transistor module with stable switching characteristics.

Preferred internal wiring inductances L1 and L2 are on the order of a few nanohenry to 10 nanohenry, which may be provided by utilizing the self-inductance of a conducting bar of the internal connecting terminal, or by a circuit pattern on the circuit substrate. The actual effects of the provided inductance may be confirmed by experiment. For simple geometric shapes, e.g., for a thin, rectangular plate, the amount of inductance provided may be calculated from a suitable formula.

We claim:

1. A power transistor module comprising:

a circuit substrate;

at least one pair of power transistor chips on the circuit substrate, respectively comprising a first (Tr1) and a second (Tr2) power transistor electrically interconnected in series as upper and lower arms of a bridge circuit;

first (D1) and second (D2) freewheel diodes connected antiparallel to the first (Tr1) and second (Tr2) power transistor, respectively;

separate first and second circuit patterns on the circuit substrate for the respective first (Tr1) and second (Tr2) power transistors, the first circuit pattern comprising a first emitter pattern and the second circuit pattern comprising a second collector pattern;

first (C1), second (C2E1) and third (E2) output terminals, and first (G1) and second (G2) gate terminals taken out from the first and second circuit patterns;

a bridge shaped internal connecting terminal interconnecting the first emitter pattern and the second collector pattern; and a signal terminal (e1) connected to the internal connecting terminal as an auxiliary emitter terminal, at a point at which a desired internal wiring inductance is provided between the internal connecting terminal and the first emitter pattern.

2. The power transistor module according to claim 1, wherein the internal connecting terminal is loosely supported to allow its movement by a terminal block.

3. The power transistor module according to claim 1, further comprising an encapsulation, and gel filling material in which the internal connecting terminal is buried.

4. The power transistor module according to claim 1, wherein the respective freewheel diodes (D1 and D2) are on the same respective circuit patterns as the power transistors (Tr1 and Tr2).

5. A power transistor module comprising:

a circuit substrate;

at least one pair of power transistor chips on the circuit substrate, respectively comprising a first (Tr1) and a second (Tr2) power transistor electrically interconnected in series as upper and lower arms of a bridge circuit, and packaged as a minimum circuit;

first (D1) and second (D2) freewheel diodes connected antiparallel to the first (Tr1) and second (Tr2) power transistor, respectively;

a first collector pattern for the first power transistor a circuit pattern on the circuit substrate, comprising a first emitter pattern for the first power transistor (Tr1) connected to a second collector pattern for the second power transistor (Tr2);

a second emitter pattern for the second power transistor (Tr2) on the circuit substrate;

first and second gate patterns for the first and second power transistors on the circuit substrate;

first (C1), second (C2E1) and third (E2) output terminals taken out from the first collector pattern, the circuit pattern and the second emitter pattern, respectively;

first (G1) and second (G2) gate terminals taken out from the first and second gate patterns, respectively;

an inductance providing region in a current path of one of the emitter patterns the current path having a width, and a slit dividing the width, forming the inductance providing region; and signal terminals (e1 and e2) as auxiliary emitter terminals for each of the power transistors (Tr1 and Tr2), a first one of said signal terminals connected to the inductance providing region at a point at which a desired internal wiring inductance is provided.

6. The power transistor module according to claim 5, wherein the respective freewheel diodes (D1 and D2) are on the same respective collector patterns as the power transistors (Tr1 and Tr2).

7. A power transistor module comprising:

a circuit substrate;

at least one pair of power transistor chips on the circuit substrate, respectively comprising a first (Tr1) and a second (Tr2) power transistor electrically interconnected in series as upper and lower arms of a bridge circuit, and packaged as a minimum circuit;

first (D1) and second (D2) freewheel diodes connected antiparallel to the first (Tr1) and second (Tr2) power transistor, respectively;

a first collector pattern for the first power transistor (TE1) on the circuit substrate;

a circuit pattern on the circuit substrate, comprising a first emitter pattern for the first power transistor (Tr1) connected to a second collector pattern for the second power transistor (Tr2);

a second emitter pattern for the second power transistor (Tr2) on the circuit substrate;

first and second gate patterns for the first and second power transistors on the circuit substrate;

first (C1), second (C2E1) and third (E2) output terminals taken out from the first collector pattern, the circuit pattern and the second emitter pattern, respectively;

first (G1) and second (G2) gate terminals taken out from the first and second gate patterns, respectively;

an inductance providing region in a current path of one of the emitter patterns;

signal terminals (e1 and e2) as auxiliary emitter terminals for each of the power transistors (Tr1 and Tr2), a first one of said signal terminals connected to the inductance providing region at a point at which a desired internal wiring inductance is provided; and marks along the inductance providing region indicating positions for connecting said first one of the signal terminals (e1 and e2).

8. The power transistor module according to claim 7, wherein the respective freewheel diodes (D1 and D2) are on the same respective collector patterns as the power transistors (Tr1 and Tr2).

* * * * *

UNITED STATES PATENT AND TRADEMARK OFFICE
CERTIFICATE OF CORRECTION

PATENT NO. : 5,616,955
DATED : April 1, 1997
INVENTOR(S) : Yamada et al.

It is certified that error appears in the above-indentified patent and that said Letters Patent is hereby corrected as shown below:

Column 9, line 27, "first power transistor" should read --first power transistor (Trl) on the circuit substrate;--;

Column 9, line 43, "patterns the" should read --patterns, the--;

Column 10, line 17, "(TE1)" should read --(Trl)--.

Signed and Sealed this

Eighteenth Day of November 1997

Attest:

BRUCE LEHMAN

Attesting Officer

Commissioner of Patents and Trademarks